(12) United States Patent
Pitwon

(10) Patent No.: US 9,500,806 B2
(45) Date of Patent: Nov. 22, 2016

(54) OPTICAL PRINTED CIRCUIT BOARD AND A METHOD OF MOUNTING A COMPONENT ONTO AN OPTICAL PRINTED CIRCUIT BOARD

(71) Applicant: Xyratex Technology Limited, Havant (GB)

(72) Inventor: Richard C. A. Pitwon, Fareham (GB)

(73) Assignee: Xyratex Technology Limited, Havant (GB)

( * ) Notice: Subject to any disclaimer, the term of this patent is extended or adjusted under 35 U.S.C. 154(b) by 0 days.

(21) Appl. No.: 14/799,760

(22) Filed: Jul. 15, 2015

(65) Prior Publication Data

US 2016/0131833 A1    May 12, 2016

(30) Foreign Application Priority Data

May 16, 2014    (GB) .................................. 1408737.3

(51) Int. Cl.
*G02B 6/12*      (2006.01)
*G02B 6/122*      (2006.01)
(Continued)

(52) U.S. Cl.
CPC ............ *G02B 6/122* (2013.01); *G02B 6/0065* (2013.01); *G02B 6/1228* (2013.01); *G02B 6/13* (2013.01); *G02B 6/42* (2013.01); *G02B 6/43* (2013.01); *H05K 1/0274* (2013.01); *H05K 3/305* (2013.01); *G02B 6/4204* (2013.01); *G02B 6/4239* (2013.01); *G02B 6/4249* (2013.01); *H01L 2224/26145* (2013.01); *H05K 3/301* (2013.01);
(Continued)

(58) Field of Classification Search
CPC .. G02B 6/122; G02B 6/0065; G02B 6/1228; G02B 6/13; G02B 6/42–6/43; G02B 6/4204; G02B 6/4239; G02B 6/4249; H05K 1/0274; H05K 3/305; H05K 3/303; H05K 3/301; H05K 2201/0133; H05K 2201/2018; H05K 2201/2036; H01L 2224/26145; Y02P 70/613
USPC ...................................... 385/14; 438/27, 118
See application file for complete search history.

(56) References Cited

U.S. PATENT DOCUMENTS

| | | | |
|---|---|---|---|
| 4,893,901 A | 1/1990 | Taumberger | |
| 8,101,254 B2 * | 1/2012 | Noguchi ................. | C08F 10/00 428/36.8 |

(Continued)

FOREIGN PATENT DOCUMENTS

| | | |
|---|---|---|
| EP | 1 249 870 A2 | 10/2002 |
| EP | 2 128 213 A1 | 3/2008 |

(Continued)

OTHER PUBLICATIONS

GB Patent Application No. 1408737.3, filed May 16, 2014; Combined Search and Examination Report issued Nov. 17, 2014; 5 pages.

(Continued)

*Primary Examiner* — Thomas A Hollweg
*Assistant Examiner* — Guy Anderson
(74) *Attorney, Agent, or Firm* — Mueting, Raasch & Gebhardt, P.A.

(57) ABSTRACT

An optical printed circuit board having at least one optical interface on a surface, and a deformable dam structure provided on the optical printed circuit board adjacent to the at least one optical interface. The deformable dam structure has an absorbent portion for absorbing adhesive and a method or forming the same.

20 Claims, 9 Drawing Sheets

(51) Int. Cl.
  *G02B 6/42* (2006.01)
  *F21V 8/00* (2006.01)
  *H05K 1/02* (2006.01)
  *G02B 6/43* (2006.01)
  *G02B 6/13* (2006.01)
  *H05K 3/30* (2006.01)

(52) U.S. Cl.
  CPC ....... *H05K 3/303* (2013.01); *H05K 2201/0133* (2013.01); *H05K 2201/2018* (2013.01); *H05K 2201/2036* (2013.01); *Y02P 70/613* (2015.11)

(56) References Cited

U.S. PATENT DOCUMENTS

| | | | |
|---|---|---|---|
| 8,836,100 B2 * | 9/2014 | Nadeau | G02B 7/025 257/432 |
| 2003/0178229 A1 * | 9/2003 | Toyoda | H01L 21/486 174/261 |
| 2006/0012967 A1 * | 1/2006 | Asai | G02B 6/43 361/764 |
| 2009/0028497 A1 * | 1/2009 | Kodama | G02B 6/43 385/14 |
| 2009/0239014 A1 * | 9/2009 | Noguchi | C08F 10/00 428/36.8 |
| 2010/0276187 A1 * | 11/2010 | Nakamura | H05K 3/4069 174/258 |
| 2011/0127633 A1 * | 6/2011 | Nadeau | G02B 7/025 257/506 |
| 2013/0156386 A1 | 6/2013 | Miller | |
| 2013/0183010 A1 * | 7/2013 | Fangman | G02B 6/36 385/93 |
| 2013/0313309 A1 * | 11/2013 | Kitajima | H01L 21/64 228/180.5 |
| 2014/0264951 A1 * | 9/2014 | Faruqui | H01L 23/5389 257/783 |
| 2015/0351217 A1 * | 12/2015 | Koukami | H05K 7/20463 361/707 |

FOREIGN PATENT DOCUMENTS

| | | |
|---|---|---|
| GB | 2526150 A | 11/2015 |
| JP | 2001174672 A | 6/2001 |

OTHER PUBLICATIONS

GB Patent Application No. 1408737.3, filed May 16, 2014; Notification of Grant issued Jun. 14, 2016; 2 pages.

* cited by examiner

FIG 1. (Prior Art)
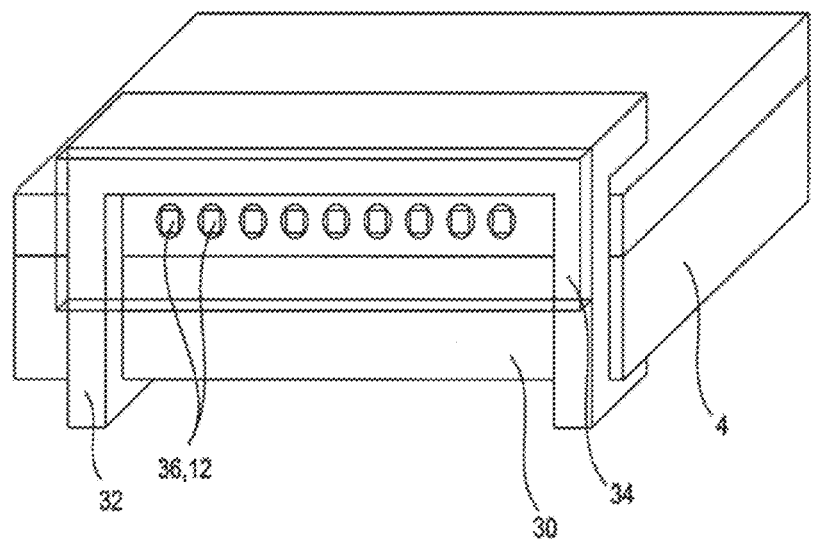
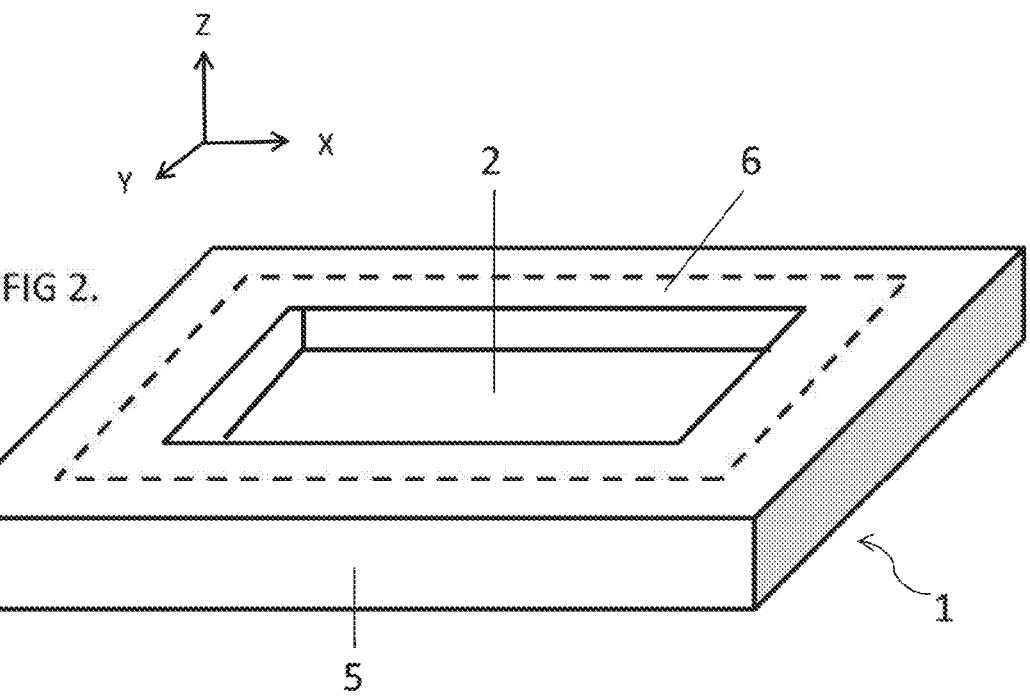

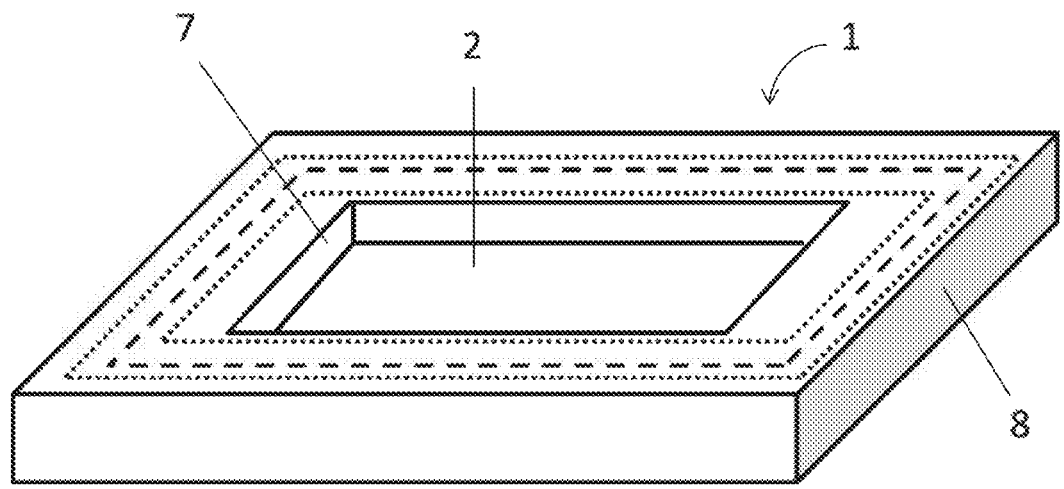
FIG 5.
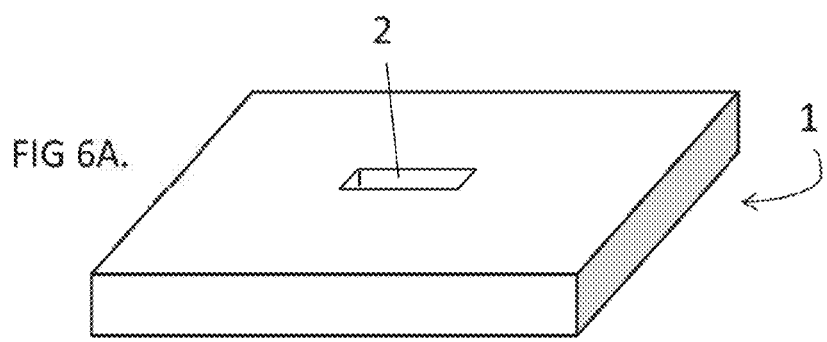
FIG 6A.
FIG 6B.
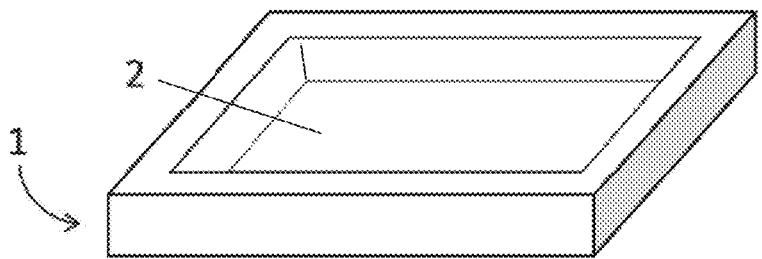

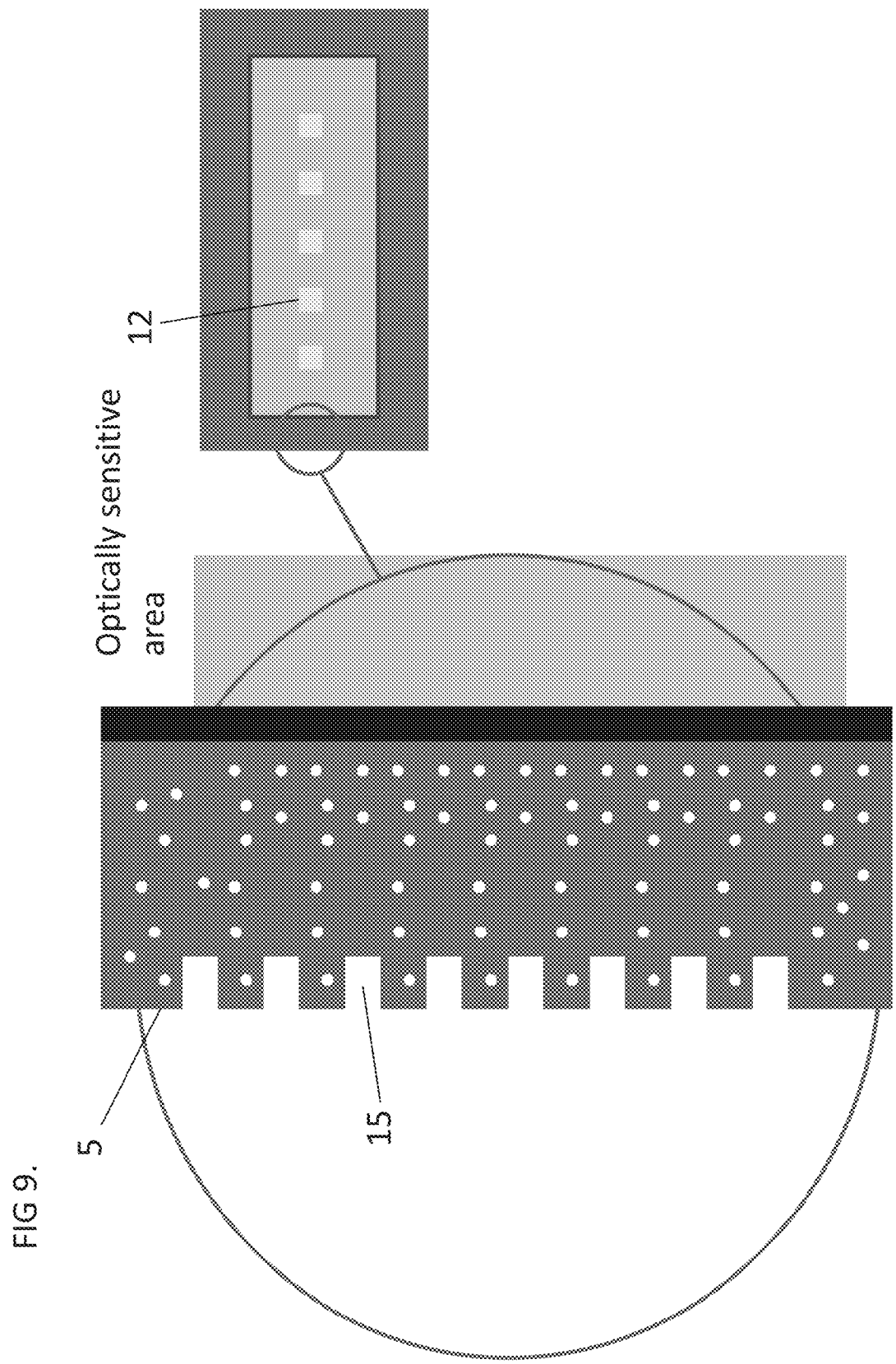

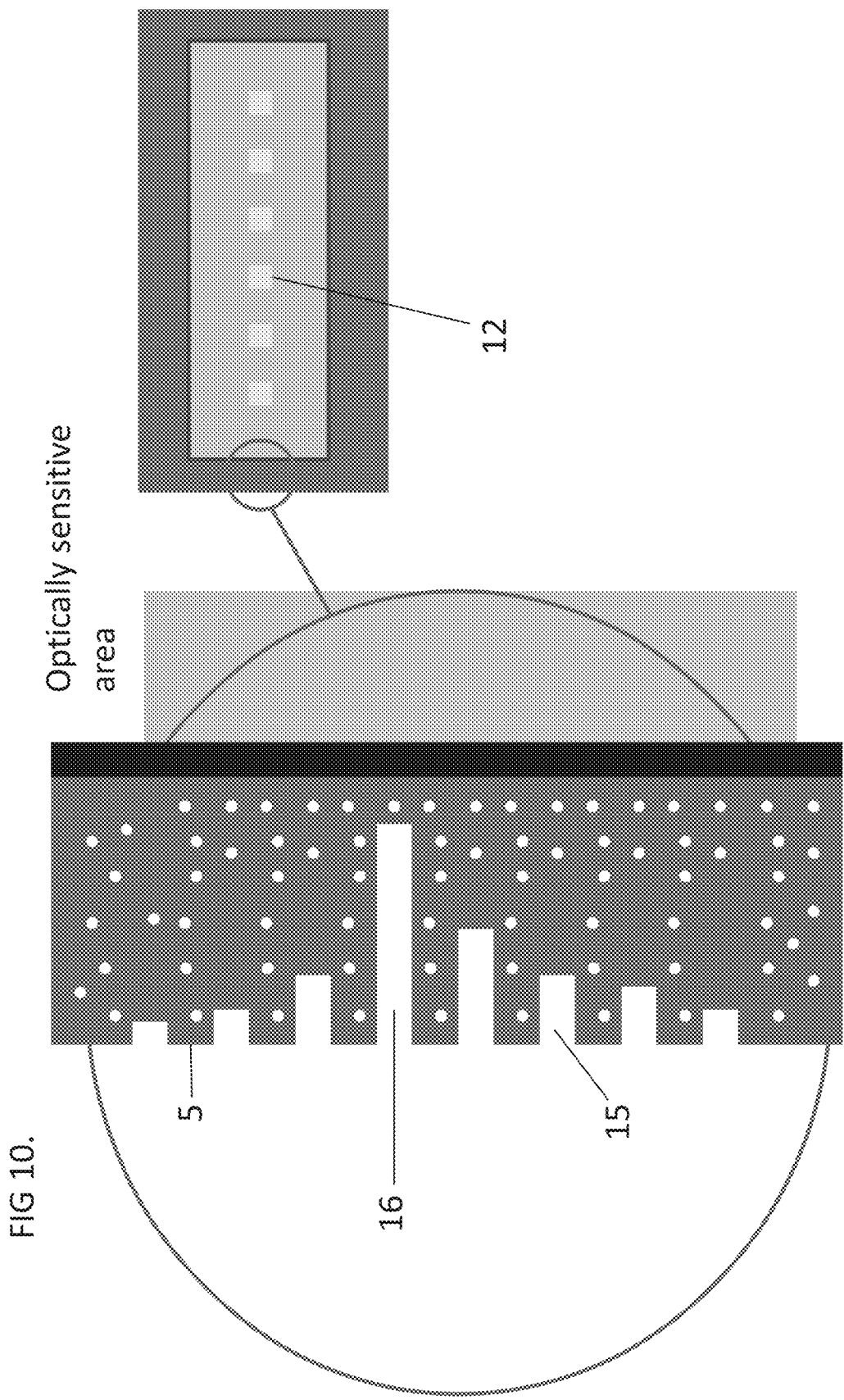

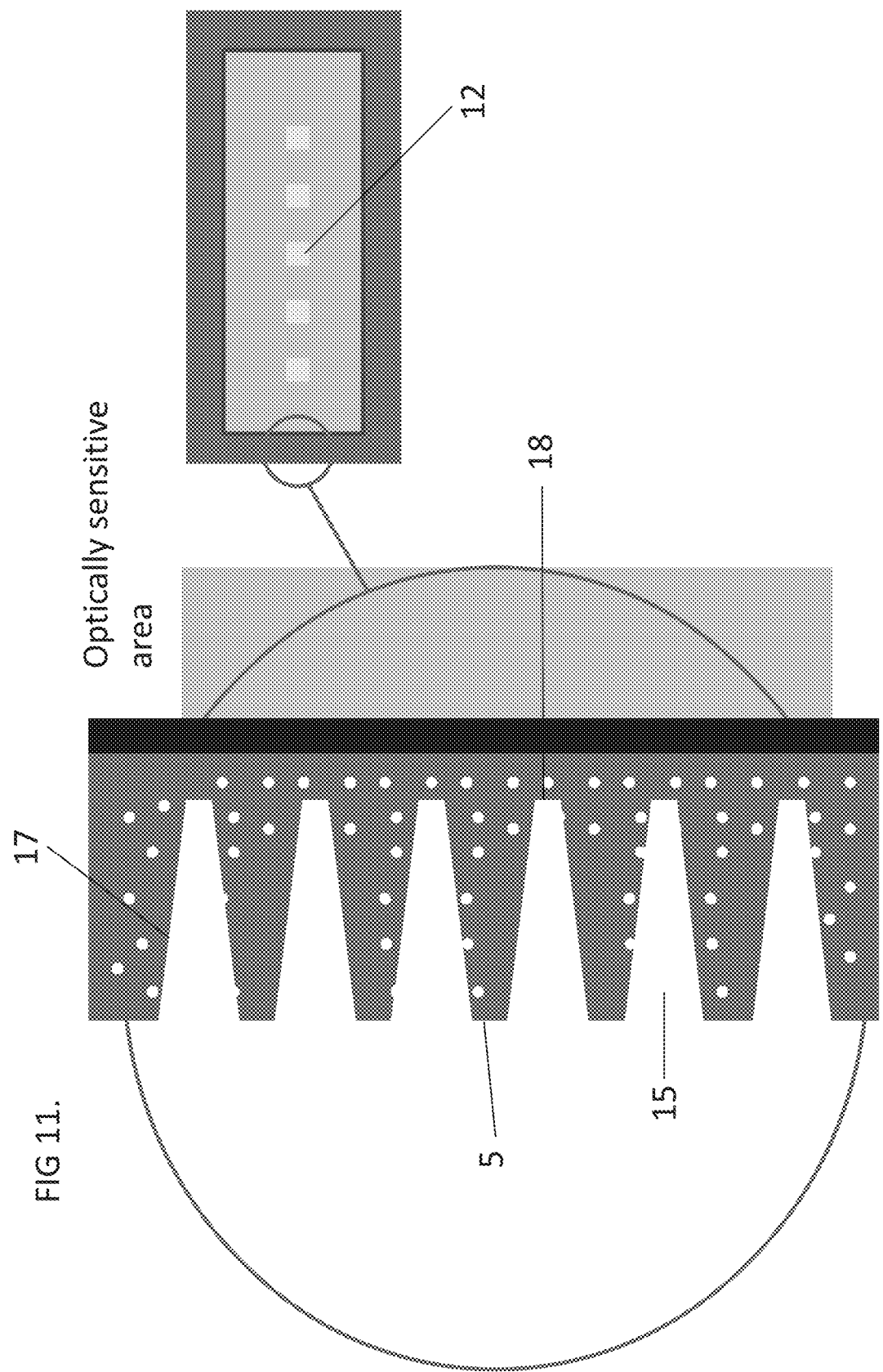

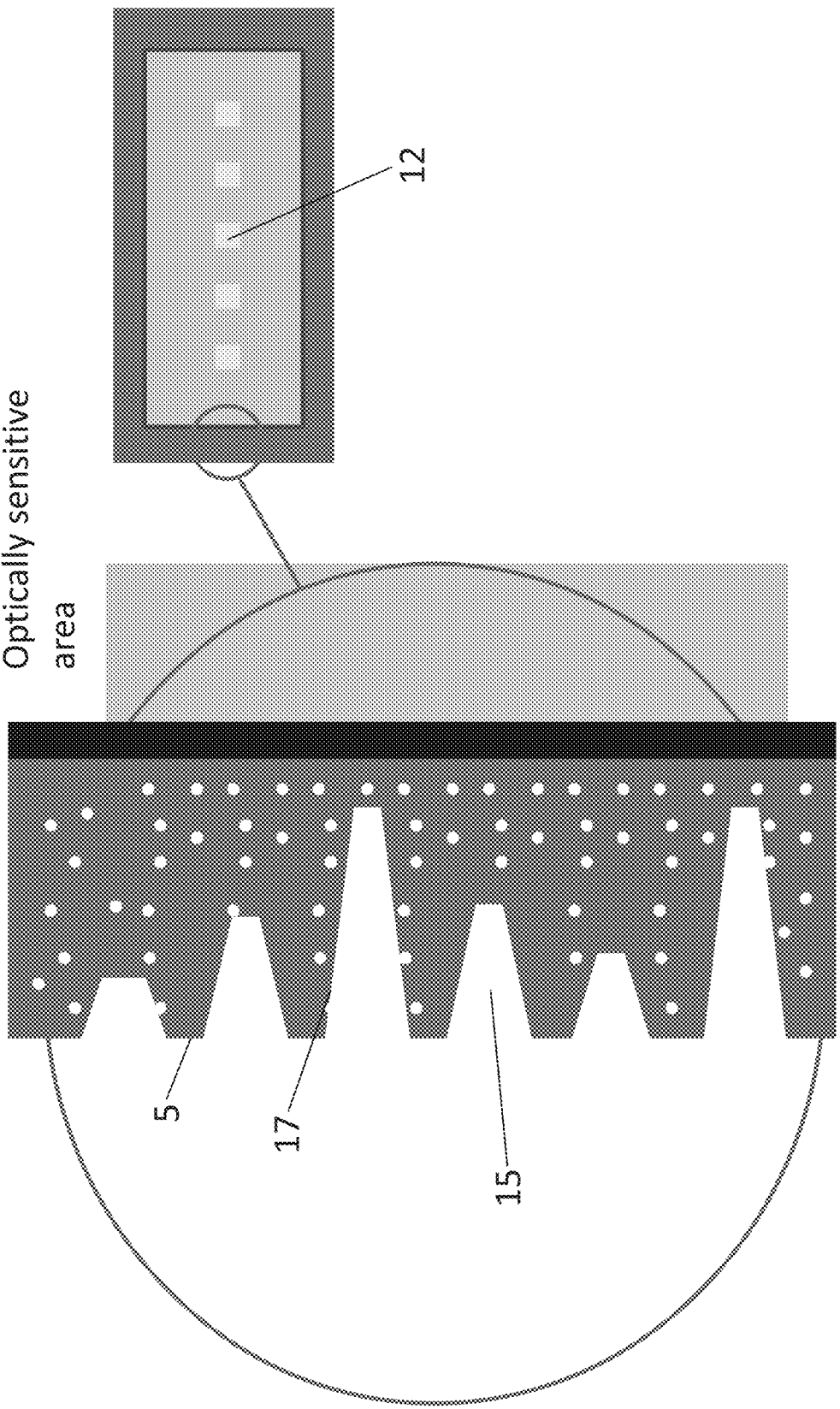

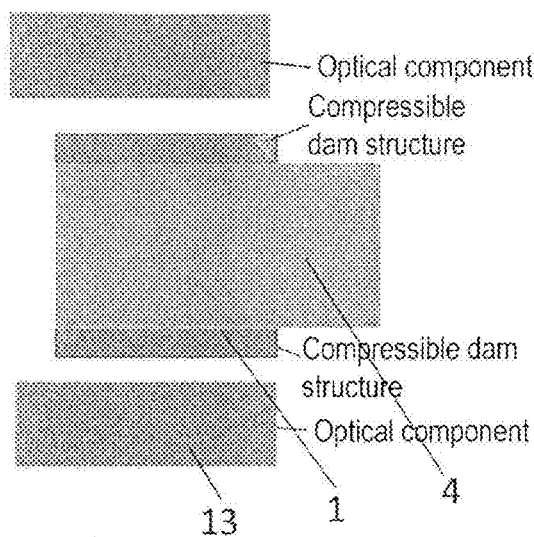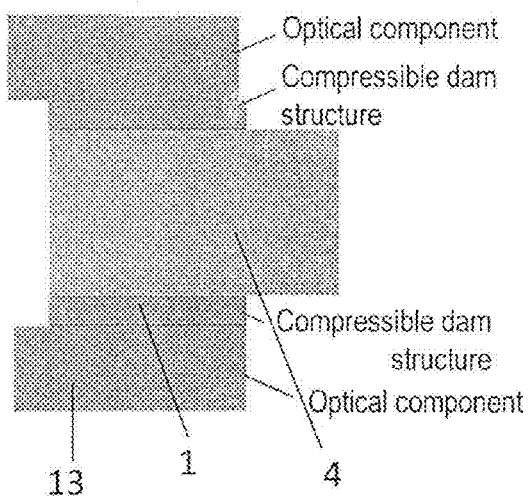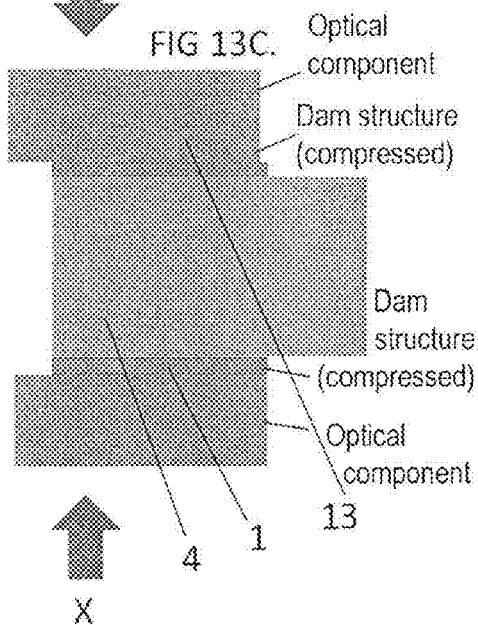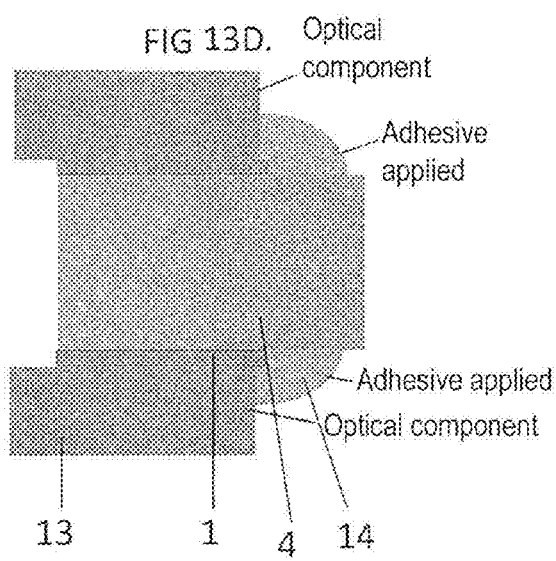

OPTICAL PRINTED CIRCUIT BOARD AND A METHOD OF MOUNTING A COMPONENT ONTO AN OPTICAL PRINTED CIRCUIT BOARD

This application claims the benefit of U.K. Patent Application 1408737.3 filed 16 May 2014 under 35 U.S.C. 119(a) and 37 C.F.R. 1.55(b) and is incorporated by reference in its entirety herein.

The present invention relates to an optical printed circuit board and to a method of mounting a component onto an optical printed circuit board. In embodiments, the invention relates to an apparatus for preventing contamination of channel interfaces during assembly of optical components onto optical printed circuit boards (PCBs), and to a method of preventing contamination.

As used herein, the term optical PCB refers to an integrated system of optica channels and components instead of or as well as electrical channels and components.

Over the past few years, the field of optical integrated circuit technology has seen considerable growth. Optical circuits combine multiple optical functions in one device or chip and afford a number of advantages over previous technologies. For example, optical signals do not produce magnetic fields in the way that a current flowing through a conductor will so that crosstalk or unwanted interaction between adjacent channels is less of a problem. Such technologies are now widely used in telecommunications, in the aerospace and automotive industries for conveying sensor information, and in high performance computing and data centre switch modules where they can provide large bandwidth capacities around processing nodes.

A further advantage is that optical components and guides may be smaller and lighter in general than their electronic counterparts. As a result, however, assembly of integrated circuits is fiddly, tolerances are small and the effect of contamination by airborne particles or materials used to assemble the circuit can badly affect optical coupling. Improvements in methods of assembly which aid alignment of components and prevent contamination during or after the assembly process are always extremely useful.

Optical PCBs are analogous to traditional electronic PCBs, but rather than (or as well as) including conductive pathways for the transfer of electrical signals they transmit information in the form of signals superimposed onto electromagnetic carrier waves and directed via integrated optical channels such as, but not limited to optical fibers, polymer waveguides and planar glass waveguides. Often the two are integrated in a hybrid board having both optical layers and conductive layers for transmission of optical and electrical signals respectively.

An example optical PCB may comprise a support layer or substrate, usually a composite material such as FR4, onto which is deposited a first layer of cladding. The core layer, which will eventually form the waveguides of the circuit, is laid down over the first cladding layer. A mask is then applied to this core layer which can either define the intended waveguide profiles or can represent the inverse (i.e. areas between the waveguides). In the former case exposed material can be removed using a process such as reactive ion etching, leaving the masked areas intact to form the waveguides. In the latter case a photo-curable liquid polymer is used so that subsequent irradiation with electromagnetic radiation will harden the exposed regions intended to form the waveguides. The unexposed and thus uncured regions can be washed away using a suitable developing chemical solvent.

A second cladding layer is then applied over the surviving waveguide structures the core layer. Because the refractive index of the waveguide core is always higher than that of the cladding, optical signals will undergo total internal reflection and will be contained within the guides.

Regions where the light enters or leaves a waveguide are known as optical interfaces, common to all optical PCBs. These interfaces may be at the level of the core layer in a "socket" cut out of the PCB material, alternatively the signal may be redirected to the surface of the PCB or it may meet the surface at one of the edges. Optical components are mounted over these interfaces to receive or transmit signals or to align connectors and components with optical channels.

Any additional material in the region of an interface may scatter or absorb light, reducing the efficiency of signal transfer. Foreign material can also change the refractive properties of the interface region, causing reflection or deflection of light away from its intended path. Because of the importance of ensuring a clear signal and the small margins of error involved it is desired that the interfaces are protected from pollutants, particularly at the assembly stage when the risk of contamination is highest.

Indeed, as well as ensuring that the interfaces are, in general, kept clean, it is during assembly and manufacture that dirt and impurities can most easily inadvertently be introduced to the optical interfaces. Mounting of optical components involves accurately aligning them with respect to the waveguides to achieve proper optical coupling, thus allowing signals to be transmitted as efficiently as possible. Often, various guiding or alignment features are used to help the user to achieve this. Once aligned, the relative position of the components and waveguide interfaces must be precisely maintained for continued function of the component in the circuit. This is generally achieved by fixing the component to the circuit board substrate using some type of adhesive substance, such as epoxy resin.

Whichever type of adhesive is used, it is usually applied to the PCB or to the component itself by one of a number of known methods including use of a needle, syringe, spray, or brush, and is subsequently cured and hardened (usually by UV irradiation and/or heating depending on requirements). The adhesive can be applied either manually or as pad of an automated process but either way, due to the small size of the devices involved, accurate application of this adhesive is challenging.

In some examples, a mechanical housing may be mounted around the optical interface to accommodate pluggable connectors. These housings may be designed to hold which may be referred to as a "first optical component", will need to be fixed in place on the PCB, again using adhesive.

Often components mounted on a PCB or housings designed to hold components will completely enclose the optical interface over which they are mounted. This provides a protective cover and, in normal use, prevents contaminants such as dust particles from reaching the interface. However, contamination of the optical interface by the adhesive used in mounting is also a problem and can seriously inhibit efficient signal transfer and thus proper functioning of the PCB. Once a component is mounted, it is very difficult to access the optical interface for cleaning. Furthermore, to effectively clear adhesive from the interfaces without causing damage to optical surfaces can be difficult.

During the assembly process some adhesive may seep or wick from the join between an optical component and substrate into the vicinity of the interface. Additionally, outgassing of the adhesive may occur over a long period after the assembly process has been completed, slowly reducing the optical coupling efficiency, and negatively affecting the strength of the adhesive bond.

FIG. 1 shows an example of a PCB having an optical component mounted by traditional methods. A lens array 34 is mounted to a housing 32 and the housing fixed using adhesive to the edge of an optical printed circuit board 4. The printed circuit board comprises a support layer and an optical layer containing waveguides for transmission of optical signals. Lenses 36 are mounted over the interfaces of these waveguides. Lenses 36 must be carefully aligned with waveguide interfaces 12 to provide proper coupling between the two. The adhesive used to attach the housing to the PCB is generally in a liquid form until it is cured and may run into the vicinity of the interfaces before hardening, and/or outgassing may lead to contamination at a later stage.

Several prior art documents describe attempts to prevent contamination of interfaces prior to and during assembly of optical components on PCBs. Commonly owned US-A-2013/0156386, the entire contents of which is hereby incorporated by reference, describes a mechanism by which a slideable shield is deployed to protect an optical component prior to optical connection.

U.S. Pat. No. 4,893,901 discloses the mounting of optical components on a substrate by means of an "intermediate carrier" spot welded to a housing rather than attached using an adhesive.

JP/2001/174,672 aims to solve the problem of excess adhesive being applied during fixing of a component. This excess adhesive can contaminate important regions of the circuit board and can cause slipping of components relative to the PCB surface which can result in a loss of optical coupling. The circuit board substrate in this case is equipped with a series of grooves designed to carry away excess adhesive.

Some attempt has also been made to identify adhesives with low outgassing values; or adhesives which are easier to apply in a thin layer and less liable to run on application (EP-A1-2128213). However, the adhesive type must necessarily be specific to the particular component and substrate. For example, adhesives are often heat cured and a temperature sensitive component will preclude the use of certain materials.

According to a first aspect of the present invention, there is provided an optical printed circuit board having at least one optical interface on a surface, and a deformable dam structure provided on the optical printed circuit board adjacent to the at least one optical interface, wherein the deformable dam structure has an absorbent portion for absorbing adhesive.

The present invention provides an optical PCB and a protective structure that prevents contamination of optical interfaces during and after the mounting of one or more optical components or housings over interfaces on the optical PCB. The protective structure is also somewhat absorbent and thus allows adhesive to penetrate at least part of the way in. Preferably, the protective structure is absorbent and deformable like a sponge. The adhesive can later harden and thus the deformable dam structure can provide protection from contamination without sacrificing the strength of the join between the circuit board and the component or housing. Preferably the protective structure is at least moderately transparent to curing radiation, in order to cure adhesive absorbed within its structure.

Potential candidate materials with these characteristics include porous low density polymer foams, open-cell foams, such as reticulated foams and silicone foams. The materials should be preferably translucent or white to allow curing radiation to propagate into the material.

Preferably, the dam structure has an outer surface distal the at least one optical interface, and the absorbent portion is adjacent to and includes this outer surface. This allows the adhesive to be applied to the edge furthest from the optical interfaces and to be absorbed part of the way into the structure. The edge nearest to the interfaces may remain completely free of adhesive so that the interfaces are protected by the inner portion of the structure. The absorbed adhesive can later harden to form a robust properly formed connection between the PCB and mounted component.

In some embodiments the outer surface is uneven. An uneven outer surface increases the surface area exposed to adhesive and therefore allows a stronger hold to the mounted component or optical circuit board surface. An uneven surface may take many forms including dimpling, channels, waves, etched fins and so on. Any configuration of the surface whereby the surface area is increased relative to a planar configuration is advantageous in improving the holding strength after adhesive has been applied.

In some embodiments the outer surface contains channels. Channelling provides an easy way to increase the surface area of the outer surface. The geometry of the channels may vary, for example channels may be cuboid in shape forming crenellations, may have a rounded base, or may contain narrower portions to slow the flow of adhesive into the structure if required. The channels may extend part or all the way across the outer surface of the structure, however longer channels are preferable in order to maximise the increase in surface area provided by the channelling.

In some embodiments the size of the channels varies across the outer surface. This variation in size may be provided by a difference in the depth of the channels or in the cross-sectional area or both. Changing the size of the channels allows the manufacturer control over the effective penetration depth of the adhesive into the structure across some or all of the outer surface.

In some embodiments the channels are tapered. A narrowing profile deeper into the structure provides a means to decrease the absorbency further into the structure. This can be controlled by varying the slope of the taper. Again, the profile of the tapered channels can vary across the outer surface to control the level of the absorbency grading and how it varies across the structure. It may be preferable for the dam structure to have a greater effective penetration depth nearer to the surfaces to which it is attached when mounted in order to provide a greater hold with minimal wastage of adhesive.

Preferably, the dam structure has an inner surface adjacent to the at least one optical interface, and a non-absorbent portion adjacent to and including this inner surface. The presence of a non-absorbent portion will ensure that the adhesive cannot reach the waveguide interfaces, particularly if excess is applied in error. Any adhesive on the inner surface of the dam will be liable to run over the waveguide interfaces or to outgas, again decreasing coupling efficiency.

Preferably, the dam structure completely surrounds the at least one optical interface. Fully enclosing the optical interfaces further ensures against the intrusion of dirt and impurities. Contamination by the adhesive itself is also less likely to occur as it is not possible for adhesive to spread or run around the edge of the dam structure and reach the interfaces this way.

In an embodiment, the dam structure is formed of at least two different materials. For example, a non-absorbent film can be applied to the inner edge of an absorbent structure to form a non-absorbent barrier.

In an embodiment, the dam structure is formed of a single material. In some embodiments the whole structure is absorbent, and in others the dam is treated in some way to render a portion of it non-absorbent. Forming the dam out of one material (particularly if no treatment is required) may reduce manufacturing effort and cost.

In some embodiments, the absorbency of the structure is graded from the inner edge to the outer edge. A graded absorbency (either dearly stepped or more continuous) eliminates the sharp boundary between absorbent and non-absorbent portions. On application of the adhesive, such a barrier could potentially result in a build-up of the adhesive and cause an increase in pressure between the component and PCB. It is important that components remain in exact position for proper optical coupling so that any forces acting to displace the component are unwanted.

In some embodiments, the dam structure is bent by at least 90 degrees, and extends over at least one edge of the optical PCB. In the example shown in FIG. 1 the base of the housing 32 extends over three sides and two edges of the PCB 4. Applying adhesive when the components are in place can be an advantage in that it is easier to maintain their position during the process. In such cases adhesive is applied to the base of the housing at the housing edge (and possibly also to the PCB surface and deformable dam). In order to achieve the strongest possible bond, it is advantageous for the deformable dam structure also to follow these edges. Furthermore, supporting the housing around the full extent of its base helps to prevent any relative movement both during and after assembly. The dam structure can be produced in a bent configuration for specific applications. If a force is applied to bend the structure, the structure may hold the desired configuration when the force is removed. This way the dam can be mounted onto a component or PCB with ease.

Preferably, the dam structure is compressible with negligible spring-back force. The structure may be formed of a spongy material, for example, which can be easily compressed.

Components must be very precisely situated and should move as little as possible during assembly. Any spring-back force on the component will encourage unwanted movement away from the PCB surface and make accurate mounting more difficult.

According to a second aspect of the present invention there is provided a method of mounting a component onto an optical printed circuit board having one or more optical interfaces, the method comprising: providing a deformable dam structure on the surface of the optical printed circuit board near to the one or more optical interfaces, the deformable dam structure having an absorbent portion for absorbing adhesive; providing a first component on the deformable dam structure; applying an adhesive to at least part of the absorbent portion; hardening the adhesive so that the first component is fixed in place.

In an embodiment, prior to applying the adhesive, the deformable dam structure is compressed. If enough adhesive is applied prior to compression it will tend to leak out as the volume decreases. Excess adhesive on the PCB surface will need to be removed at a later stage and makes contamination of, or damage to, components and interfaces more likely. Application of adhesive after compression of the dam prevents this from occurring.

In another embodiment, after applying the adhesive, the deformable dam structure is compressed. While excess adhesive may run as explained above, it can be better absorbed into the structure prior to compression. This helps to ensure that the absorbent portion is saturated with adhesive. The surface over which the dam is bonded to the optical component or PCB is then as large as possible and a strong join can be achieved.

In an embodiment, the deformable dam structure is mounted first on the first component and then, together with the first component, on the optical PCB. If other components surround the interface region near to which the dam structure is to be applied, placement on the circuit board may be more challenging and it may be more difficult to avoid damage. Applying the structure to a separate component first and then aligning and attaching both on the PCB together may be easier in such a case than applying the dam structure to the PCB first.

In an embodiment, a second component is mounted on the first component over the at least one optical interface. Often some sort of housing is fixed in place on the PCB to which a further optical component can be easily attached. This is the case in the example shown in FIG. 1 where a housing 32 is mounted to a PCB 4 and then an array of lenses 34 onto the housing.

In an embodiment, the method further comprises providing a second deformable dam structure between the first component and the second component. Because of the advantages of preventing relative movement of optical components, some type of adhesive may be used to fix a second component in place. As when mounting the first component onto the PCB surface, this adhesive can run onto optical interfaces or interfere with optical coupling at a later stage due to outgassing. Use of a second deformable dam structure mounted between the first and second components (for example the housing 32 and lens array 34 of FIG. 1) will help to prevent contamination of interfaces during and after this second mounting process.

According to a third aspect of the present invention, there is provided an optical printed circuit board having at least one optical interface on a surface; a deformable dam structure of the type described above in contact with the circuit board near to the at least one optical interface, and an optical component mounted on the deformable dam structure over the at least one optical interface.

Embodiments of the present invention will now be described in detail with reference to the accompanying drawings, in which FIG. 1 shows a prior art example of a lens and housing mounted on a PCB over optica interfaces;

FIG. 2 shows an isometric view of a deformable dam structure;

FIG. 5 shows an example of a deformable dam structure having graded absorbency;

FIG. 6A shows a deformable dam structure with a small cut-out portion;

FIG. 6B shows a deformable dam structure with a large cut-out portion;

FIG. 9 shows a close-up of the outer edge of a dam structure, which is patterned to increase surface area and thus adhesive bond strength;

FIG. 10 shows a close-up of the outer edge of a dam structure, which is patterned with guiding channels or trenches of varied depths into the structure;

FIG. 11 shows a close-up of the outer edge of a dam structure, in which the guiding channels are tapered to provide graded absorbency;

FIG. 12 shows a close-up of the outer edge of a dam structure, which is patterned with tapered guiding channels or trenches of varied depths into the structure; and FIGS. 13A-13D illustrate steps in the process of mounting a component on a PCB using a deformable dam.

FIG. 2 is an isometric view of a deformable dam structure. The structure comprises a cuboid that is thin in the z direction (away from the PCB surface) and has a rectangular cut-out section 2 in the centre. In cases where it is intended to apply adhesive all the way around an interface or set of interfaces, the deformable dam 1 and central cut-out 2 may be any size and shape that will allow the structure to be placed on the surface of a PCB such that the interfaces are located within the cut-out section 2 and are completely surrounded by the dam structure 1. The walls, for example, need not necessarily be the same width all the way around. Depending on where interfaces are located and on the size and shape of the component to be mounted, it may be advantageous for the wall to be wider in some sections so that more adhesive can be absorbed to form a stronger join where interfaces lie further from the outer edge of the component.

Figure 3A:
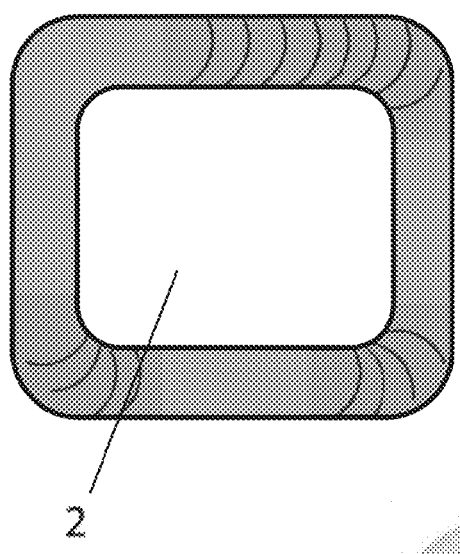
FIGS. 3A-3C show examples of alternative shapes for the deformable dam structure.
Figure 3B:
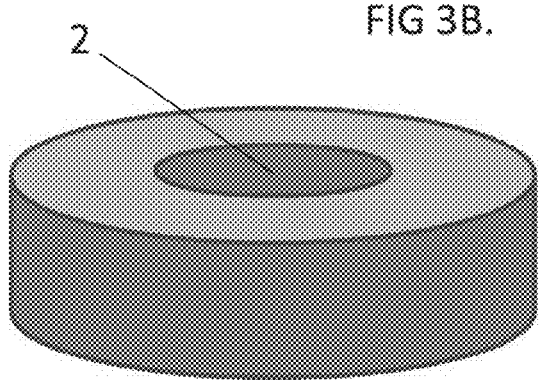
Figure 3C:
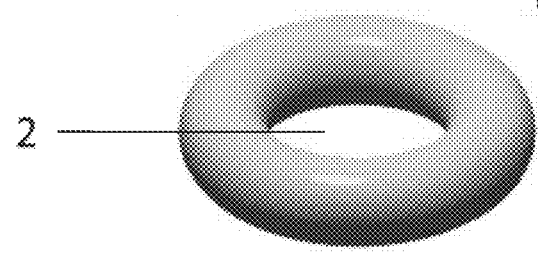

Some examples of possible geometries for the dam are shown in FIGS. 3A-3C. The dam can take the shape of, for example, a continuous section of tubing or filled tubing (3A), a disc (3B) or a torus (3C). It may also have differently sized and shaped cut-out sections and corners and edges may be smooth rather than angular.

The dam may be produced by a number of methods including cutting from a larger sheet of material, moulding, or by extrusion of material through a nozzle or similar.

If it is only required to fix a component at one side of an interface, it will be sufficient to apply a deformable dam just to this side of the interface, although entirely surrounding an interface is still preferable since this affords protection from both running and outgassing of the adhesive. The deformable dam structure may also be formed of several pieces placed separately around optical interfaces where required allowing a bit more flexibility in shape and size.

Figure 4:
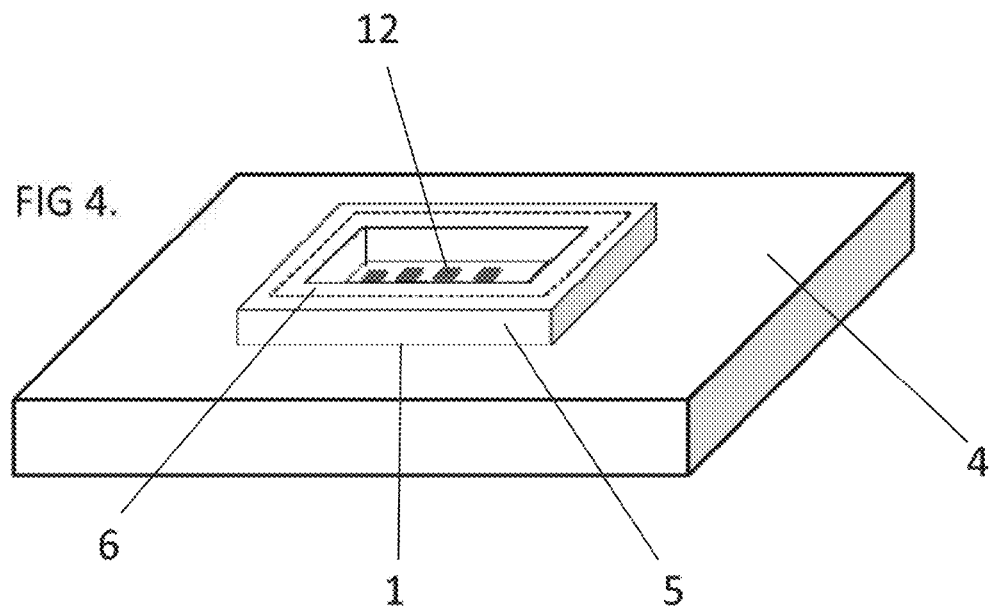
FIG. 4 shows the deformable dam structure in place on a PCB around a set of waveguide interfaces.

Referring again to FIG. 2, the dam comprises an absorbent portion 5 located outward of the cut-out section and a non-absorbent portion 6 adjacent to the cut-out section. The non-absorbent portion 6 will be closer to the optical interfaces once the dam has been positioned on the surface of the PCB. FIG. 4 shows the dam structure 1 in place on an optical PCB 4 around optical interfaces 12.

During application, adhesive is applied to the absorbent outer edge 5 of the dam and the component to be mounted set in place on top of the dam such that it is optically coupled with the optical interfaces 12. The absorbent portion 5 of the dam allows uncured adhesive to penetrate the structure to an extent as it is applied. The absorbed adhesive is later cured and hardened so that the dam structure is no longer deformable and the optical component is fixed in place, aligned with optical interfaces 12 on the PCB 4. Preferably the absorbent portion 5 of the structure is absorbent enough to act as a sponge, soaking up excess adhesive. The excess adhesive will then not pass over or underneath the dam structure and will be less likely to run elsewhere, i.e. towards other components mounted on the same circuit board.

When the adhesive penetrates as far as the non-absorbent portion 6 it is prevented from travelling any further through the structure. The dam may be formed of two separate materials or, alternatively, one material may be treated to render a part of it non-absorbent. The use of guiding channels with appropriate geometries would be an effective way of allowing one material with low adhesive penetration depth to be used. The geometries of the guiding channels would then control the level of penetration into the structure and by ensuring that the guiding channels stay sufficiently far from the inner boundary (at a distance greater than adhesive penetration depth), then the adhesive will not migrate into the optically sensitive area.

FIG. 5 shows an example of another embodiment of a deformable dam according to the present invention. Here the dam is formed of a plurality of materials having different absorbencies ranging from very absorbent on the outer surface 8, which will be farthest from the waveguide interfaces when the dam structure is in place on the PCB, to non-absorbent on the inner surface 7, which will be adjacent to the waveguide interfaces. The structure could also be formed of one material, treated or patterned to achieve the same effect, such as through the provision of tapered guiding channels. This stepped structure will prevent adhesive from building up at the interface between the absorbent and non-absorbent portions and providing unwanted outward pressure on the component, which must remain in precise position during assembly.

The size of the central cut-out may vary depending on requirements. The dam can have thick walls which may extend from the outer edge of the mounted component (or even slightly outward of this) substantially inward towards the waveguide interfaces (FIG. 6A) or it can comprise a thin strip of material (FIG. 6B). The larger the absorbent area, the larger the area over which the component is bonded to the surface of the PCB (via the deformable dam) and thus the stronger the join. The shape of the dam structure will depend on the relative sizes and shapes of the interface region and the optical component to be mounted.

The dam structure of FIG. 2 is at least partially composed of a spongy material which is compressible with the application of very little force in the sense that its shape will adapt to any pressure applied to the structure (at least in a direction perpendicular to the PCB surface when mounted). The dam may be compliant such that if the applied pressure is removed the structure will return to its original shape. This way if unwanted pressure is applied in error during application the dam structure will still be useful. Alternatively, the deformable structure may retain its shape when the applied pressure is removed. This is desirable since the component must remain extremely still and thus spring-back force from the dam structure on the component before the adhesive has dried should be minimized. It may also be possible to provide a dam structure that will compress and hold its shape, but can be returned to its original form in response to some further treatment. The spongy nature of the material also allows adhesive to be absorbed easily, which upon curing will harden the dam structure itself and fix the component in place.

Figure 7:
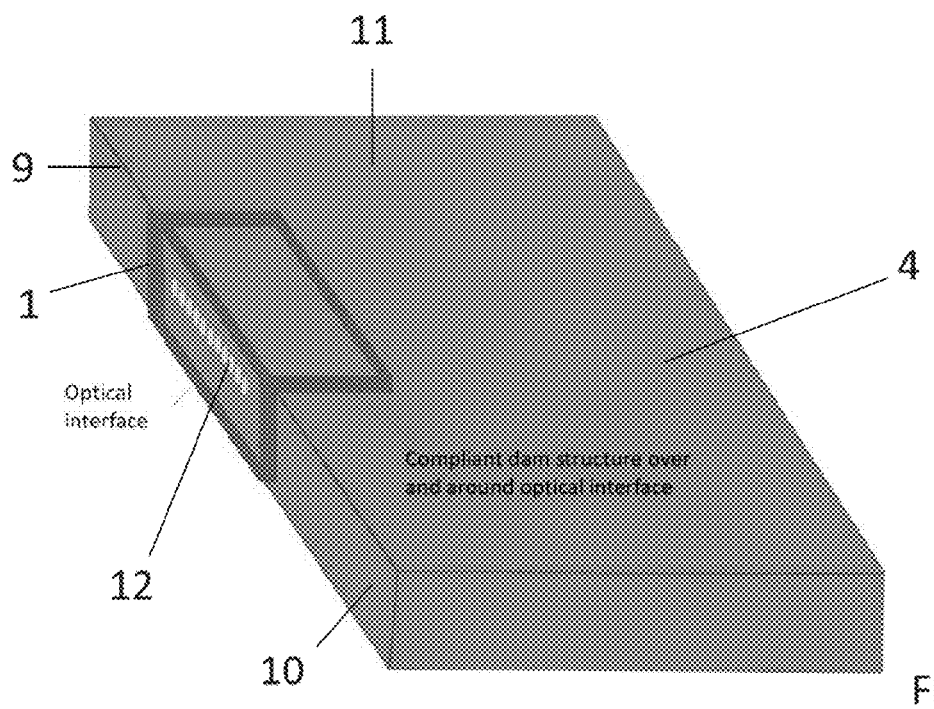
FIG. 7 shows a deformable dam extending over an edge at 90 degrees.

In this embodiment the dam structure is bendable to at least a 90 degree angle so that it can extend over two sides of a circuit board. This may be necessary if the component to be mounted itself extends over an edge of the PCB. As shown in FIG. 7, for example, the deformable dam structure extends over the edge 9 of the PCB 4 and the plane of face 10 of the PCB 4 is at an angle of 90 degrees to the plane of face 11. This allows adhesive to be applied to a component all the way around its edge, helping to provide a strong bond with the PCB surface. Of course, the deformable dam can also extend over more than one edge. The dam structure is thus deformable both in the sense that it can be easily compressed or its shape altered by the application of pressure and in the sense that it is flexible and can be bent to fit around corners as described above.

Figure 8:
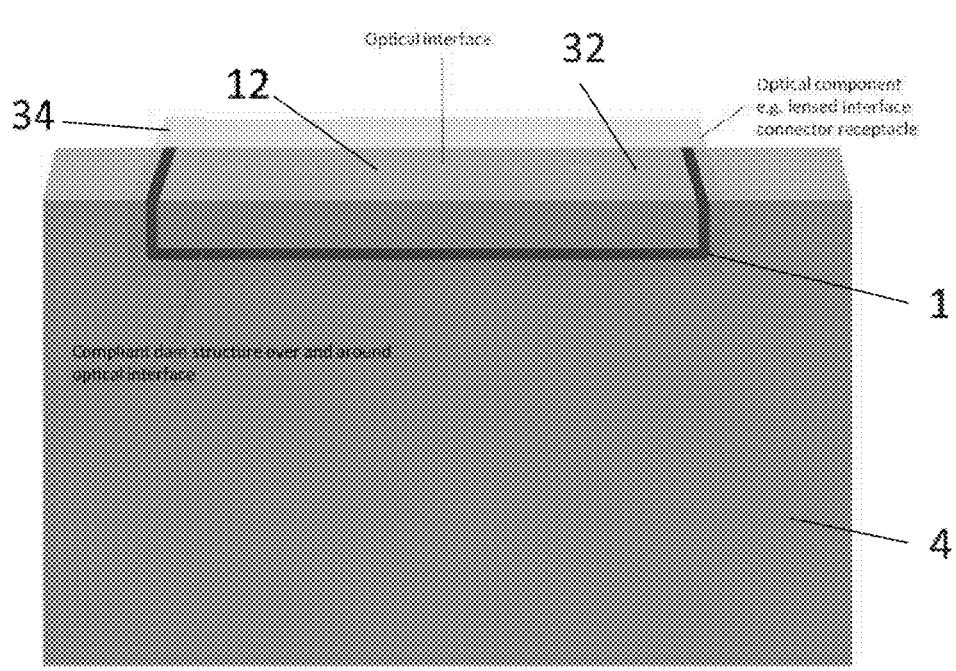
FIG. 8 shows a deformable dam structure in place on a PCB with a housing and lens mounted above.

FIG. 8 shows such a deformable dam structure 1 in use with the apparatus of FIG. 1. Instead of applying a layer of adhesive directly between the PCB and component as in FIG. 1, a protective deformable dam structure 1 is in place between the PCB surface and the housing 32/lens array 34 combination. The lensed portion 34 may be mounted before or after the housing is positioned on the PCB surface. A user can deploy a second protective dam structure between the lens and housing in order to prevent leakage of adhesive during the mounting of the lens onto the housing or later due to outgassing. This is particularly useful if it is necessary to mount and fix a lens or other component onto the housing after mounting of the housing itself on the PCB surface. In other words, a first component (the housing) and first deformable dam are mounted onto the PCB and a second component (the lens array) and second deformable dam are mounted on the first component so that interfaces are protected from contamination by adhesive wherever it is applied during assembly. Adhesive applied outward of the protective structure can penetrate some distance into it but cannot travel all the way through and thus will not reach the waveguide interfaces.

FIGS. 9 to 12 illustrate a deformable dam structure having an uneven or patterned outer surface. A patterned surface will increase the surface area exposed to the adhesive resulting in an improved hold, which is particularly useful for smaller structures. FIG. 9 shows a dam structure with channels 15 etched into the outer surface 5. In the embodiment shown these channels are straight and have a rectangular side profile but their geometry can vary and they may be any shape provided that the outer surface area of the dam is increased in comparison with a dam structure that has a simple flat surface. For example, channels may be wavy and have a rounded profile or contain constrictions to slow the progression of adhesive through the structure. Alternatively, unevenness can be provided by a dimpled or pockmarked surface rather than the etching of fins or channels.

In FIG. 10 the patterning includes occasional etched features 16 which penetrate deep into the dam structure in order to provide a guiding channel and allow deeper penetration of the adhesive into the structure. The depth of channels 15 can be varied across the surface as shown to provide controlled variation in penetration depth. This way, more delicate areas can be protected by allowing only shallow penetration of the adhesive. At the same time, where possible, adhesive can be allowed to penetrate further into the structure in order to provide the strongest possible hold and a robust structure once the adhesive has hardened.

The channels 15 of FIG. 11 have tapered edges 17 so that they narrow somewhat as they penetrate further into the structure. This provides a graded absorbency since adhesive can penetrate more easily nearer to the outer surface where the width of the channel is larger. This grading can be controlled by adapting the extent of the taper. The extent (or slope) of the taper can vary across the structure and channel can narrow to a point rather than having a flat base 18 as shown. When combined with controlled variations in channel depth and shape the penetration depth and speed can be finely tuned. An embodiment having channels that vary in depth as well as being tapered is shown in FIG. 12.

FIGS. 13A to 13D illustrate a method of mounting an optical component 13 on a PCB 4 according to an embodiment of the present invention. First, as depicted in FIG. 13A, a deformable dam structure 1 is positioned on the surface of an optical PCB 4. The outer surfaces of the dam structure may be slightly sticky (for example, the structure could comprise a peelable backing with a sticky surface below). This may help to prevent movement of the structure during application and facilitate accurate positioning of the component, which is particularly important prior to the application of the adhesive. It will still be necessary to apply adhesive in order to harden the structure. Equally, applying adhesive to the dam before mounting on the optical component (or PCB) may help to hold the dam in place during the rest of the assembly process. As shown in FIG. 13B, the component 13 is then placed over the dam structure 1 to align interfaces on the PCB with the correct elements of the optical component. Following the placement of the component 13, a force (indicated by the arrows X in FIG. 13C) is applied which pushes the component towards the PCB 4 and compresses the dam structure. Finally, as shown in FIG. 13D, an adhesive 14 is applied to the outer edges of the dam structure 1, component 13 and PCB 4. Any known manual or automated application method can be used including application by needle, syringe, brush or spray. The adhesive is allowed to penetrate the absorbent portion and the components are held or left in place as the adhesive is cured.

Adhesive can be applied to the absorbent portion of the dam structure prior to mounting on the PCB or after. If the former method is used then, as the dam is compressed, adhesive may be forced out of the structure. The dam structure is more absorbent prior to compression and can hold more adhesive. Applying adhesive before compression does, therefore, help to ensure that the entirety of the absorbent portion is saturated with the adhesive before hardening. Because it is desired to provide as strong a bond as possible between the component and PCB, the more of the absorbent portion of dam structure that holds adhesive and the larger the surface area of the join, the better.

In an embodiment the dam structure is first applied to the component and then the component plus dam placed on the PCB in the required position. A sticky upper surface in this case is an advantage as it helps to prevent the dam structure from moving relative to, or separating from, the component prior to placement on the PCB.

The dam structure will also help to protect against contamination of optical interfaces by other materials required for optical assembly.

Embodiments of the present invention have been described with particular reference to the examples illustrated. However, it will be appreciated that variations and modifications may be made to the examples described within the scope of the present invention.

In many embodiments, an optical printed circuit board having at least one optical interface on a surface, and a deformable dam structure is provided on the optical printed circuit board adjacent to the at least one optical interface. The deformable dam structure has an absorbent portion for absorbing adhesive.

In many embodiments, the deformable dam structure has an outer surface distal the at least one optical interface, and the absorbent portion is adjacent to and including the outer surface. In many of these embodiments, the outer surface is uneven and may contain channels where the depth of the channels vary across the outer surface. In some of these embodiments, the channels are tapered.

In any of the embodiments, the deformable dam structure has an inner surface adjacent to the at least one optical interface, and a non-absorbent portion adjacent to and including the inner surface.

In any of the embodiments, the deformable dam structure completely surrounds the at least one optical interface.

In any of the embodiments, the deformable dam structure is formed of at least two materials.

In any of the embodiments, wherein the deformable dam structure is formed of a single material In any of the embodiments, the absorbency of the deformable dam structure is graded from the inner edge to the outer edge.

In any of the embodiments, the deformable dam structure is bent by at least 90 degrees, and extends over at least one edge of the optical printed circuit board.

In any of the embodiments, the deformable dam structure is compressible with negligible spring-back force.

A method of mounting a component onto an optical printed circuit board having one or more optical interfaces is described. The method comprising providing a deformable dam structure on the surface of the optical printed circuit board near to the one or more optical interfaces, the deformable dam structure having an absorbent portion for absorbing adhesive; providing a first component on the deformable dam structure; applying an adhesive to at least part of the absorbent portion; and hardening the adhesive so that the first component is fixed in place.

In many of these method embodiments, prior to applying the adhesive, the deformable dam structure is compressed.

In many of these method embodiments, after applying the adhesive, the deformable dam structure is compressed.

In any of these method embodiments, the deformable dam structure is mounted on the first component and then, together with the first component, on the optical PCB.

In any of these method embodiments, a second component is mounted on the first component over the at least one optical interface.

In any of these method embodiments, providing a second deformable dam structure between the first component and the second component.

In any of these method embodiments, the deformable dam structure has an outer surface and an inner surface such that once the deformable dam structure is provided on the optical printed circuit board the inner surface is adjacent to the at least one interface, the outer surface is distal the at least one optical interface, and the absorbent portion is adjacent to and includes the outer surface.

In any of these method embodiments, the outer surface is uneven and the outer surface may contain channels that may have a depth that varies across the outer surface. In some of these embodiments the channels are tapered.

In many of these method embodiments, the deformable dam has a non-absorbent portion adjacent to and including the inner surface.

In many of these method embodiments, once the deformable dam structure is provided on the optical printed circuit board, it completely surrounds the at least one optical interface.

In many of these method embodiments, the deformable dam structure is formed of at least two materials.

In many of these method embodiments, the deformable dam structure is formed of a single material.

In many of these method embodiments, the absorbency of the deformable dam structure is graded from the inner edge to the outer edge.

In many of these method embodiments, providing the deformable dam structure on the optical printed circuit board further comprises bending the deformable dam structure by at least 90 degrees such that it extends over at least one edge of the optical printed circuit board.

In any of these method embodiments the deformable dam structure is compressible with negligible spring-back force.

In many embodiments a deformable dam structure for provision on an optical printed circuit board adjacent to an optical interface, the dam structure having a first side arranged in use nearest to the optical interface and a second side arranged in use furthest from the optical interface, wherein the first side is liquid impermeable and the second side is absorbent.

This disclosure provides an optical printed circuit board substantially as shown in and/or described with reference to any one or more of FIGS. 1 to 13 of the accompanying drawings.

This disclosure provides a method of mounting a component onto an optical printed circuit board having one or more optical interfaces, the method being substantially as shown in and/or described with reference to any one or more of FIGS. 1 to 13 of the accompanying drawings.

This disclosure provides a deformable dam structure for provision on an optical printed circuit board adjacent to an optical interface, the dam structure being substantially as shown in and/or described with reference to any one or more of FIGS. 1 to 13 of the accompanying drawings.

The invention claimed is:

1. An optical printed circuit board having at least one optical interface on a surface, and a deformable dam structure provided on the optical printed circuit board adjacent to the at least one optical interface, the deformable dam structure having an absorbent portion for absorbing adhesive.

2. The optical printed circuit board of claim 1, wherein the deformable dam structure has an outer surface distal the at least one optical interface, and the absorbent portion is adjacent to and including the outer surface.

3. The optical printed circuit board of claim 2, wherein the outer surface is uneven.

4. The optical printed circuit board of claim 3, wherein the outer surface contains channels.

5. The optical printed circuit board of claim 4, wherein the depth of the channels varies across the outer surface.

6. The optical printed circuit board of claim 4, wherein the channels are tapered.

7. The optical printed circuit board of claim 1, wherein the deformable dam structure has an inner surface adjacent to the at least one optical interface, and a non-absorbent portion adjacent to and including the inner surface.

8. The optical printed circuit board of claim 1, wherein the deformable dam structure completely surrounds the at least one optical interface.

9. The optical printed circuit board of claim wherein the deformable dam structure is formed of at least two materials.

10. The optical printed circuit board of claim 1, wherein the deformable dam structure is formed of a single material.

11. The optical printed circuit board of claim 1, wherein the absorbency of e deformable dam structure is graded from the inner edge to the outer edge.

12. The optical printed circuit board of claim 1, wherein the deformable dam structure is bent by at least 90 degrees, and extends over at least one edge of the optical printed circuit board.

13. The optical printed circuit board of claim 1, wherein the deformable dam structure is compressible with no spring-back force.

14. A method of mounting a component onto an optical printed circuit board having one or more optical interfaces, the method comprising:
   providing a deformable dam structure on the surface of the optical printed circuit board adjacent to the one or more optical interfaces, the deformable dam structure having an absorbent portion for absorbing adhesive;
   providing a first component on the deformable dam structure;
   applying an adhesive to at least part of the absorbent portion; and
   hardening the adhesive so that the first component is fixed in place.

15. The method of claim 14, wherein, prior to applying the adhesive, the deformable dam structure is compressed.

16. The method of claim 14, wherein, after applying the adhesive, the deformable dam structure is compressed.

17. The method of claim 14, wherein the deformable dam structure is mounted on the first component and then, together with the first component, on the optical PCB.

18. The method of claim 14, wherein a second component is mounted on the first component over the at least one optical interface.

19. The method of claim 18 further comprising providing a second deformable dam structure between the first component and the second component.

20. The method of claim 14, wherein the deformable dam structure has an outer surface and an inner surface such that once the deformable dam structure is provided on the optical printed circuit board the inner surface is adjacent to the at least one optical interface, the outer surface is distal the at least one optical interface, and the absorbent portion is adjacent to and includes the outer surface.

\* \* \* \* \*

UNITED STATES PATENT AND TRADEMARK OFFICE
CERTIFICATE OF CORRECTION

PATENT NO.       : 9,500,806 B2
APPLICATION NO.  : 14/799760
DATED            : November 22, 2016
INVENTOR(S)      : Richard C. A. Pitwon It is certified that error appears in the above-identified patent and that said Letters Patent is hereby corrected as shown below:

In the Claims

Column 12, Line 57, Claim 9 please insert -- 1, -- after the word "claim."

Column 12, Line 62, Claim 11 please delete "e" and insert -- the --

Signed and Sealed this
Eighth Day of August, 2017

Joseph Matal
*Performing the Functions and Duties of the*
*Under Secretary of Commerce for Intellectual Property and*
*Director of the United States Patent and Trademark Office*